United States Patent
Wellhausen (10) Patent No.: US 7,300,855 B2
(45) Date of Patent: Nov. 27, 2007

(54) REVERSIBLE OXIDATION PROTECTION OF MICROCOMPONENTS

(75) Inventor: Uwe Wellhausen, Dresden (DE)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 11/270,294

(22) Filed: Nov. 9, 2005

(65) Prior Publication Data

US 2006/0105553 A1   May 18, 2006

(30) Foreign Application Priority Data

Nov. 12, 2004   (DE) .................. 10 2004 054 818

(51) Int. Cl.
  *H01L 21/76* (2006.01)
(52) U.S. Cl. ................. 438/431; 257/E21.267
(58) Field of Classification Search ............... 438/431; 257/E21.079, E21.267, E21.278, E21.559
See application file for complete search history.

(56) References Cited

U.S. PATENT DOCUMENTS

| | | | | |
|---|---|---|---|---|
| 5,258,333 A | * | 11/1993 | Shappir et al. | 438/762 |
| 5,330,935 A | * | 7/1994 | Dobuzinsky et al. | 438/767 |
| 6,228,779 B1 | * | 5/2001 | Bloom et al. | 438/763 |
| 6,313,007 B1 | | 11/2001 | Ma et al. | |
| 6,333,547 B1 | * | 12/2001 | Tanaka et al. | 257/649 |
| 6,503,815 B1 | | 1/2003 | Hsu | |
| 6,566,210 B2 | | 5/2003 | Ajmera et al. | |
| 2002/0182893 A1 | * | 12/2002 | Ballantine et al. | 438/795 |
| 2003/0040189 A1 | | 2/2003 | Chang et al. | |
| 2003/0181049 A1 | | 9/2003 | Huang et al. | |
| 2004/0067612 A1 | | 4/2004 | Guyader et al. | |
| 2004/0082197 A1 | * | 4/2004 | Gluschenkov et al. | 438/787 |
| 2004/0198019 A1 | | 10/2004 | Yasui et al. | |

* cited by examiner

*Primary Examiner*—W. David Coleman
(74) *Attorney, Agent, or Firm*—Jenkins, Wilson, Taylor & Hunt, P.A.

(57) ABSTRACT

In a method for the reversible oxidation protection of microcomponents, a substrate is provided, a silicon nitride layer is provided on the substrate in order to protect it against oxidation, an insulation layer is applied to the silicon nitride layer, and a reoxidation process is carried out. In the reoxidation process are generated oxygen radicals which are passed through the insulation layer to the silicon nitride layer in order to convert silicon nitride of the nitride layer into silicon dioxide.

22 Claims, 6 Drawing Sheets

REVERSIBLE OXIDATION PROTECTION OF MICROCOMPONENTS

BACKGROUND OF THE INVENTION

1. Field of the Invention

The present invention relates to a method for the reversible oxidation protection of microcomponents, in particular of semiconductor components.

2. Description of the Related Art

Although applicable in principle to any desired components, the present invention and the problem area on which it is based are explained below with regard to integrated circuits, and in particular memory circuits using silicon technology that are fabricated using so-called STI technology (STI=Shallow Trench Isolation).

In modern memory chips, a multiplicity of trenches are introduced into a semiconductor substrate. These trenches serve on the one hand for isolating adjacent memory cells, for which purpose an STI process (STI=Shallow Trench Isolation) is used. On the other hand, individual trench capacitors are embedded as part of a memory cell in the trenches, for which purpose a so-called deep trench (DT) technology is used. In the case of the STI process, the trenches are filled with a dielectric material, for example silicon dioxide. The trenches are filled using known filling methods, for example, such as the HDP method (HDP=High Density Plasma) or the SOD method (SOD=Spin-on Dielectric), which is a further development of the generally known spin-on-glass method (SOG). In the case of spun-on insulation layers, such as the aforementioned SOG or SOD, these insulation layers flow and thus fill the trench.

With the increasing integration of modern memory chips and the accompanying reduction of the feature sizes, the trenches have an ever higher aspect ratio, with the consequence that the filling properties and thus the quality of the insulation material introduced into the trench no longer satisfy the demands for modern memory chips without further measures. In particular for modern technologies in the so-called "deep sub-micron" range, that is to say for feature sizes of 100 nm or less, there is the problem that the methods (HDP, SOD) just mentioned require a subsequent thermal process in order that the trenches are filled in a manner free of cavities. By means of this thermal process (annealing), the insulation material introduced into the trenches is densified and subsequently has the desired properties. This thermal process is carried out at relatively high temperatures in the region of approximately 950° C. in an oxidizing atmosphere. On account of the relatively high temperatures and the oxidizing atmosphere, however, there is the problem that the silicon substrate is thereby simultaneously oxidized. Particularly in the case of such semiconductor components which have very small feature sizes, the feature sizes, which are small anyway, are reduced further in an undesirable manner by means of the undesirable oxidation of the trench walls during the thermal step.

In order to prevent such undesirable oxidation of the silicon substrate by the thermal process, a protective layer acting as a diffusion barrier is typically applied to the silicon substrate. This protective layer thus prevents oxygen molecules from diffusing to the interface of the silicon substrate and thus protects the silicon substrate against the undesirable oxidation. A thin silicon nitride layer, which is generally also referred to as a nitride liner or as a nitride layer, is preferably used as the protective layer.

The nitride layer, however, has advantages only during the fabrication process, but it has electrical disadvantages on the finished semiconductor device and these disadvantages may adversely affect the electrical properties of the component. What has been found to be problematic when using a thin nitride layer in the STI trench is the fact that although this nitride layer protects the silicon substrate against an undesirable oxidation during the thermal process for densifying the insulation material, nitride layers tend to retain charges in the semiconductor component. This effect is generally also referred to as "charge trapping". These charges trapped by the nitride layer form parasitic capacitances which have an increasingly negative influence primarily as the feature sizes become increasingly smaller. In particular, these charges and the parasitic capacitances brought about thereby may result in difficult-to-control influencing of the electrical parameters of the semiconductor component.

By adapting the process parameters of the thermal process, for example by reducing the temperature, by reducing the partial pressure of the oxidizing components, by employing low pressure annealing and the like, the problem mentioned can admittedly be reduced, but not completely eliminated. Furthermore, although the adaptation of the parameters of the thermal process just mentioned realizes a reduction of the oxidation of the silicon substrate, this is also accompanied by a deterioration in the properties of the insulation material.

SUMMARY OF THE INVENTION

It is an object of the present invention to provide a method, in the case of using a nitride layer for the protection of the substrate against oxidation, for neutralizing the disadvantages accompanying this nitride layer.

The object is achieved in accordance with the invention by means of a method for the reversible oxidation protection of microcomponents, in particular of semiconductor components, comprising the method steps of:

(a) providing a substrate to be protected, preferably a silicon substrate;
(b) applying a silicon nitride layer to the substrate for protecting the substrate against oxidation;
(c) applying an insulation layer to the silicon nitride layer;
(d) carrying out a reoxidation process, in which oxygen radicals are generated and in which the oxygen radicals generated are passed through the insulation layer to the silicon nitride layer in order to convert the silicon nitride into silicon dioxide there.

The idea on which the present invention is based consists in the fact that a nitride layer which serves to protect an underlying substrate against an undesirable oxidation is removed again subsequent to said process step that is critical for the undesirable oxidation. For this purpose, a defined reoxidation of the nitride layer, which may be formed as a buried nitride layer, by way of example, is performed through an insulation layer covering said nitride layer. By means of the reoxidation, this undesirable nitride layer is at least partially converted into an oxide layer that is noncritical for the later component. The particular advantage here consists in the fact that firstly, on the one hand, a nitride layer is provided for the protection of the substrate arranged below the nitride layer. If this nitride layer is no longer required, it can also be removed again by means of the reoxidation process in a simple and thus elegant manner without the insulating layer arranged on said nitride layer having to be removed for this purpose.

The inventive method thus affords the advantages accompanying the use of the nitride layer during the fabrication process, that is to say the protection function, and also the advantages arising subsequent to the fabrication process when the nitride layer is absent, that is to say avoiding undesirable charges (traps) attached to a nitride layer.

In a restricted version of the inventive method, a chemical modification is provided for thermal treatment in the applied insulation layer or filling layer. In this case, after method step (c) and before method step (d), a densification and a chemical conversion of the applied insulation layer are performed in an oxygen-containing atmosphere at high temperature, typically at approximately 950° C.

In a further restricted version of the inventive method, the reoxidation process is performed at a very low process temperature. Process temperatures that are taken into consideration here are temperatures in the range of 700° C. to 850° C., preferably at approximately 750° C. It goes without saying that other (higher or lower) process temperatures would also be conceivable even though these are not as advantageous. With the use of such low process temperatures, the electrical and physical properties of the already processed component are not impaired or are impaired only insignificantly, as a result of which this reoxidation process can be incorporated very simply into a tried and tested process flow. In particular, the structures of the component that have already been produced are not altered or are altered only insignificantly by virtue of the relatively low temperatures.

The reoxidation process used may be a so-called LPRO process (LPRO=Low Pressure Radical Oxidation). Neverless, all reoxidation processes would also be conceivable which involve generating oxygen radicals which are passed to the nitride layer to be converted into silicon dioxide.

In a restricted version of the inventive method, method step (d), that is to say the reoxidation process, is continued until the entire silicon nitride of the silicon nitride layer has been converted into silicon dioxide. In this case, the problem of "charge trapping" described in the introduction, in which charges are thus attached to the finished component in an undesirable manner in the region of the silicon nitride layer, is completely eliminated.

The process parameters of the reoxidation process may be chosen such that the oxygen radicals generated diffuse completely through the insulation layer and are passed as far as the silicon nitride layer, that the silicon nitride layer is completely converted into silicon dioxide by means of the oxygen radicals, and that the substrate lying below the silicon nitride layer is not oxidized or oxidized only little by the oxygen radicals. The process parameters taken into account here are preferably the (partial) pressure of the oxidizing components and/or the process temperature at which the oxygen radicals are generated.

The oxygen radicals may be generated by means of a plasma at low pressure. A customary plasma reactor may be used for generating the plasma. Preferably, a pressure in the range of 0.1 torr to 1000 torr, preferably a pressure in the range of 1 torr to 100 torr, is used for the generation of the oxygen radicals by means of a plasma.

In a further restricted version of the inventive method, silicon dioxide and/or a material containing silicon dioxide is provided as the insulation layer. Primarily very high-quality thermal silicon dioxide or silicon dioxide produced by deposition is appropriate as the silicon dioxide. However, the material containing silicon dioxide may also have been spun on, for example by means of SOG or SOD. Instead of silicon dioxide, however, it is also possible to use any other insulation material, for example low-K material, high-K material, etc.

The insulation layer may be annealed for the purpose of densifying it and also for the purpose of eliminating cavities and so-called "seam effects" after application to the silicon nitride layer, for example in an oxidizing atmosphere. This is taken into consideration in particular for insulation layers produced by spinning-on or by deposition, since these have a lower density and thus lower insulation properties in comparison with grown insulation layers, such as thermally produced silicon dioxide, for example.

Preferably, a process temperature in the range of 800° C. to 1050° C., preferably in the range of approximately 850° C. to 900° C. is used for the annealing of the insulation layer. It goes without saying that other higher or lower temperatures would also be conceivable even though the effect of densification is lower at lower temperatures and, at higher temperatures, these may adversely influence the component and the structures applies thereto.

In a advantageous version of the inventive method, after method step (b), that is to say after the application of the silicon nitride layer to the substrate, a thin silicon dioxide layer for the protection of the substrate is applied to the surface of the substrate. This method step is based on the insight that when silicon nitride is applied directly to the substrate, for example to the bare silicon substrate, stresses typically arise at the interface between silicon nitride and the silicon substrate. These stresses can be reduced by means of a thin silicon dioxide between the substrate and the silicon nitride. Furthermore, particularly during the etching of the substrate, as is the case during the fabrication of trenches in the substrate, the substrate surface may incur damage caused by etching. By virtue of the thin silicon dioxide now being applied to the substrate surface, a defined interface to the silicon substrate is created, whereby the damage produced by the etching is advantageously eliminated at the same time.

In another advantageous version of the inventive method, after method step (c), that is to say after the application of an insulation layer to the silicon nitride layer, said silicon nitride layer is present as a buried silicon nitride layer. The insulation layer thus completely covers said silicon nitride layer.

The layer thickness of the silicon nitride layer may be between 0.1 nm and 10 nm, preferably approximately 1-2 nm. However, other, larger or smaller, layer thicknesses would also be conceivable.

In a further advantageous version of the inventive method, after method step (a), at least one trench is introduced into the substrate. Furthermore, at least in the region of the trench, a silicon nitride layer is applied to the trench walls or to the thin silicon dioxide layer applied on the trench walls. This method is preferably used in the context of a shallow trench process or alternatively a deep trench process, which are typically used for the fabrication of memory components.

A patterned silicon substrate may be provided in method step (a).

DESCRIPTION OF THE DRAWINGS

FIG. 1 is a schematic cross-sectional illustrations (a)-(d) for illustrating the general method according to the invention for providing a reversible oxidation protection for a component;

FIG. 2 is a preferred exemplary application for the method according to the invention from FIG. 1 on the basis of schematic cross-sectional illustrations (a)-(f).

In the Figures of the drawing—unless specified otherwise—identical elements and features have been provided with the same reference symbols.

Figure 1A:
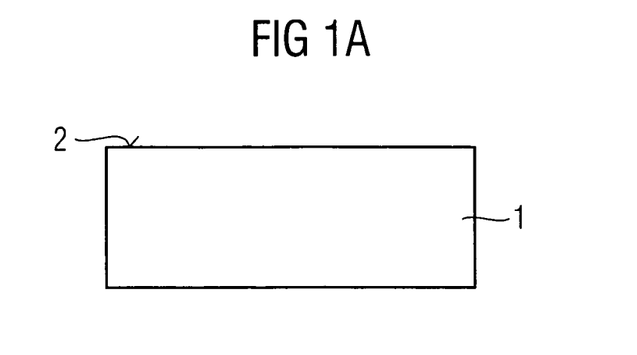
Figure 1B:
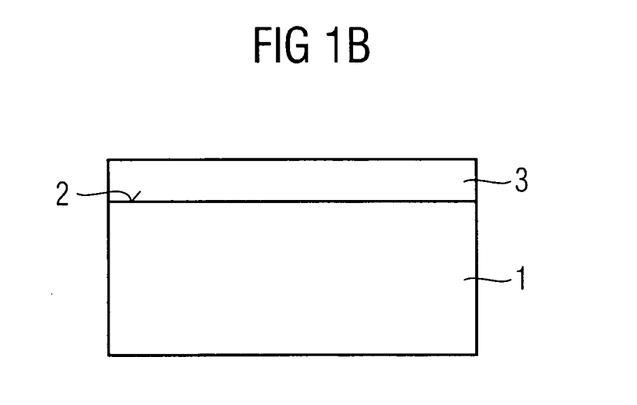
Figure 1C:
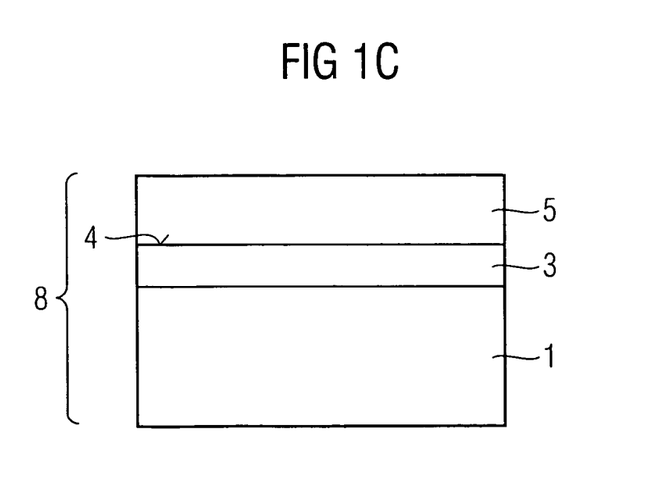
Figure 1D:
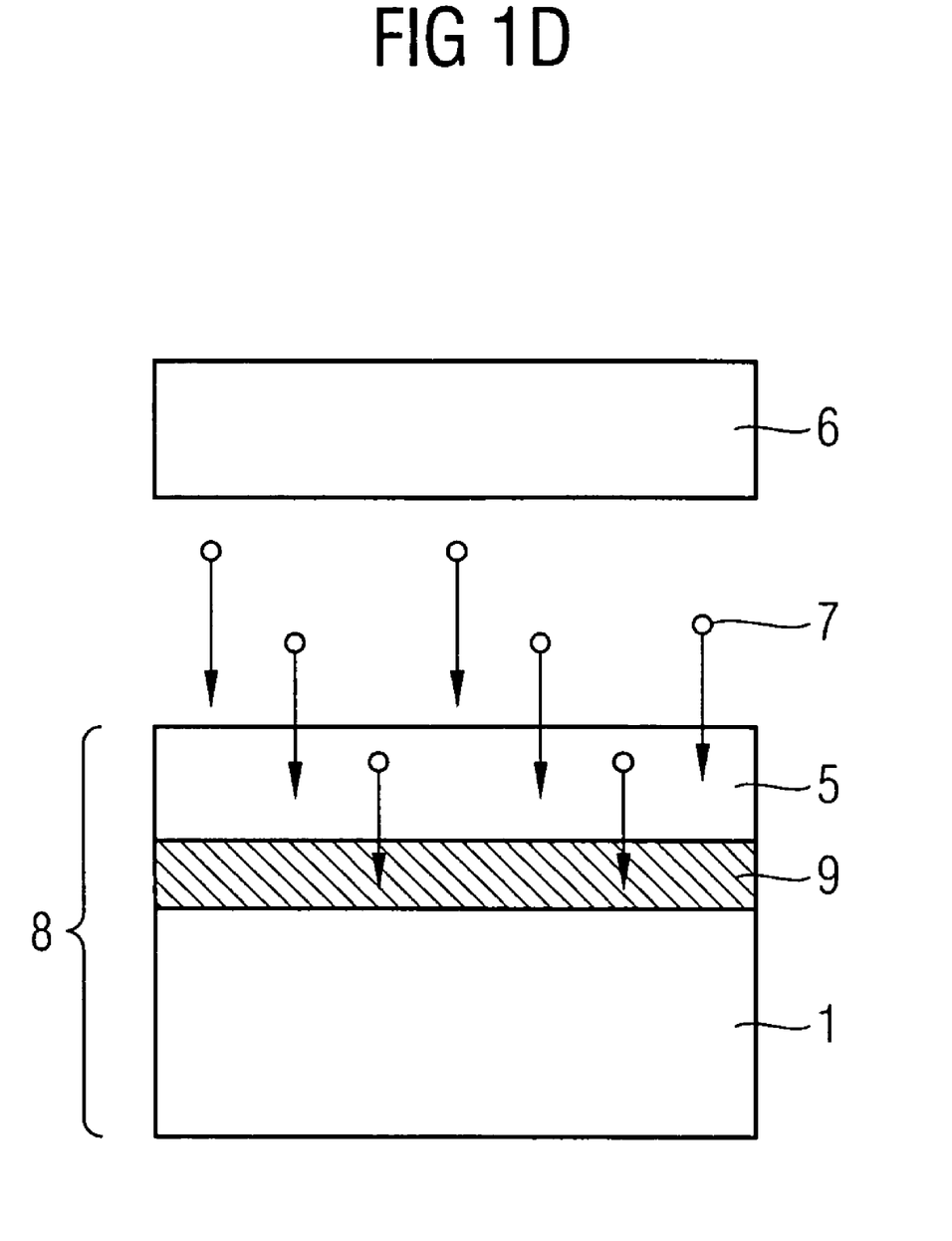

FIG. 1 shows schematic cross-sectional illustrations for illustrating the general method according to the invention. In this case, the enumeration symbols below correspond to the corresponding subfigures (a)-(d) of FIG. 1:

(a) A substrate 1 having a surface 2 is provided. The substrate 1 may be a silicon-containing semiconductor substrate, for example a crystalline silicon, or else any other substrate for a micromechanical component.

(b) A thin silicon nitride layer 3 is applied to the surface 2 of the substrate 1.

(c) A further layer 5, for example an insulation layer or a filling layer, is applied to a surface 4 of the silicon nitride layer 3. Preferably, the layer 5 is formed as an insulation layer and has silicon dioxide, for example, in the case of a silicon-containing substrate 1. The layers 3, 5 may be applied to the respective surfaces 2, 4 by vapor deposition, spinning-on, by thermal growth or in any other manner.

(d) A device 6 for generating oxygen radicals 7 is provided. A plasma reactor, for example, may be provided as the device 6. The plasma reactor 6 generates oxygen radicals 7. The oxygen radicals 7 are passed to the silicon nitride layer 3 by diffusion through the layer 5. In the silicon nitride layer 3 or at the interface 3 thereof to the layer 5, the oxygen radicals 7 react with the silicon atoms in the silicon nitride layer 3 in such a way that silicon oxide 9 arises therefrom. The nitrogen liberated from this reaction escapes from the entire arrangement 8 or remains in the arrangement 8. If a sufficient number of oxygen radicals 7 are passed to the silicon nitride layer 3, then the silicon nitride layer 3 is completely converted into a silicon dioxide layer 9.

Figure 2A:
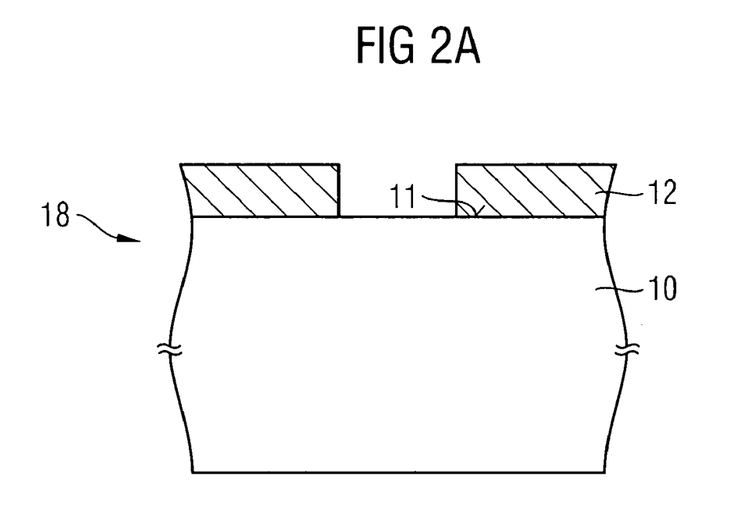
Figure 2B:
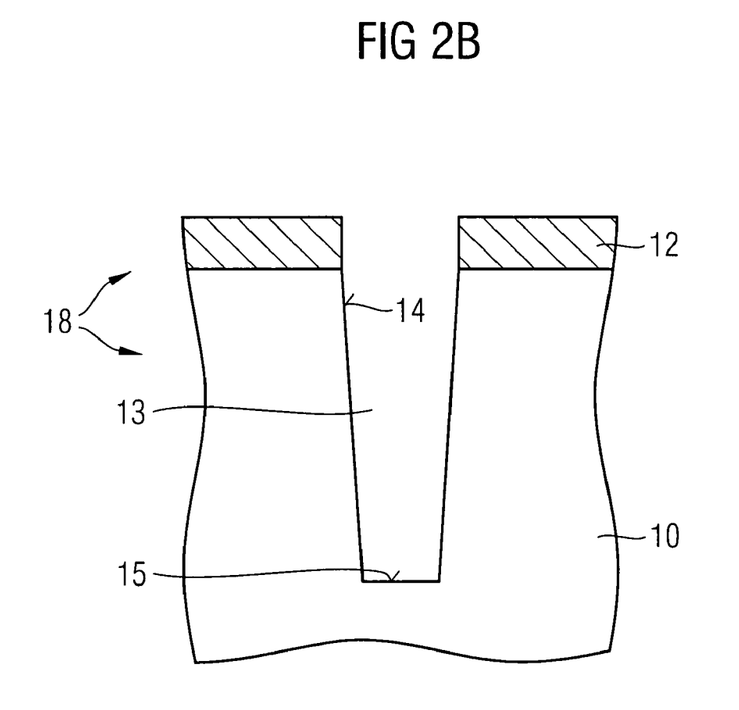
Figure 2C:
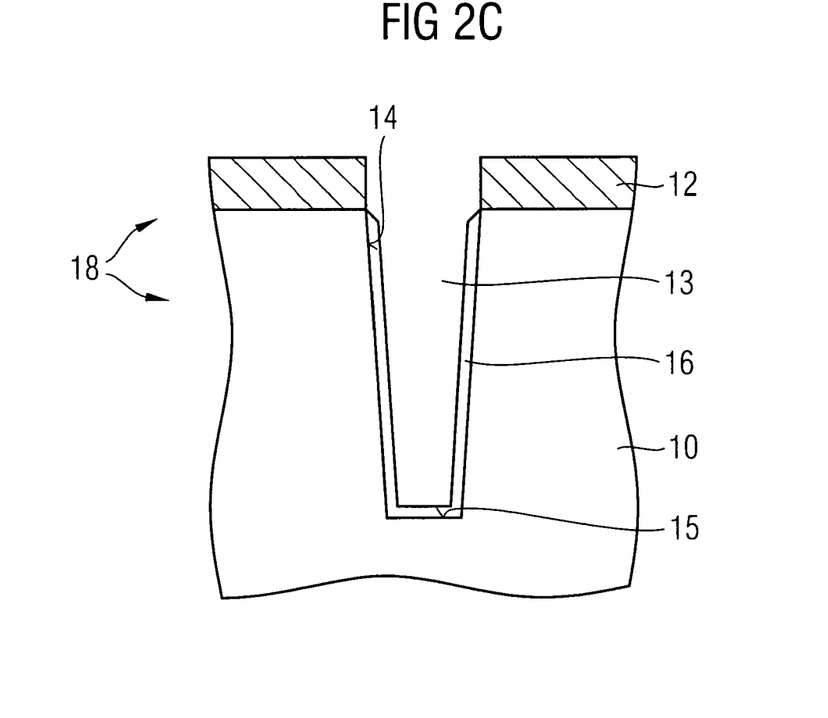
Figure 2D:
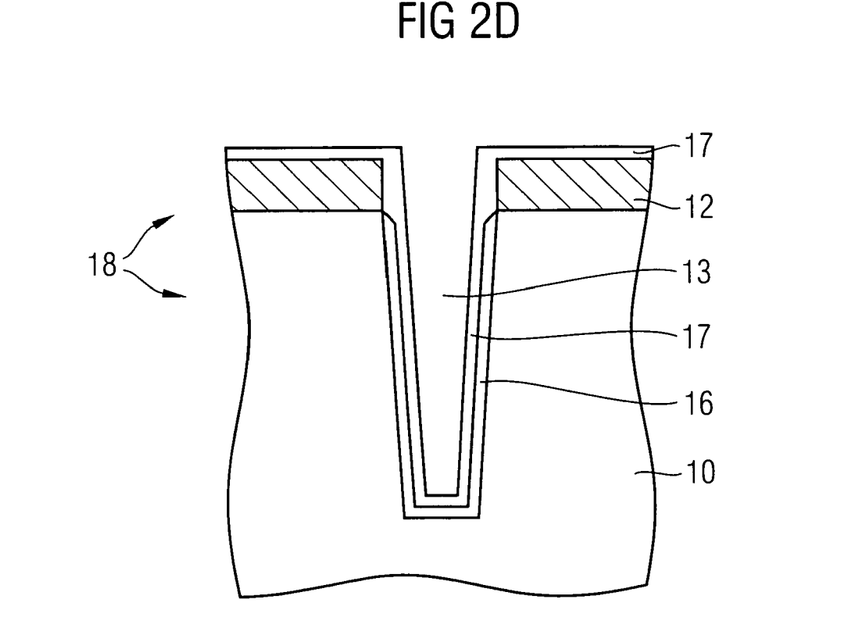
Figure 2E:
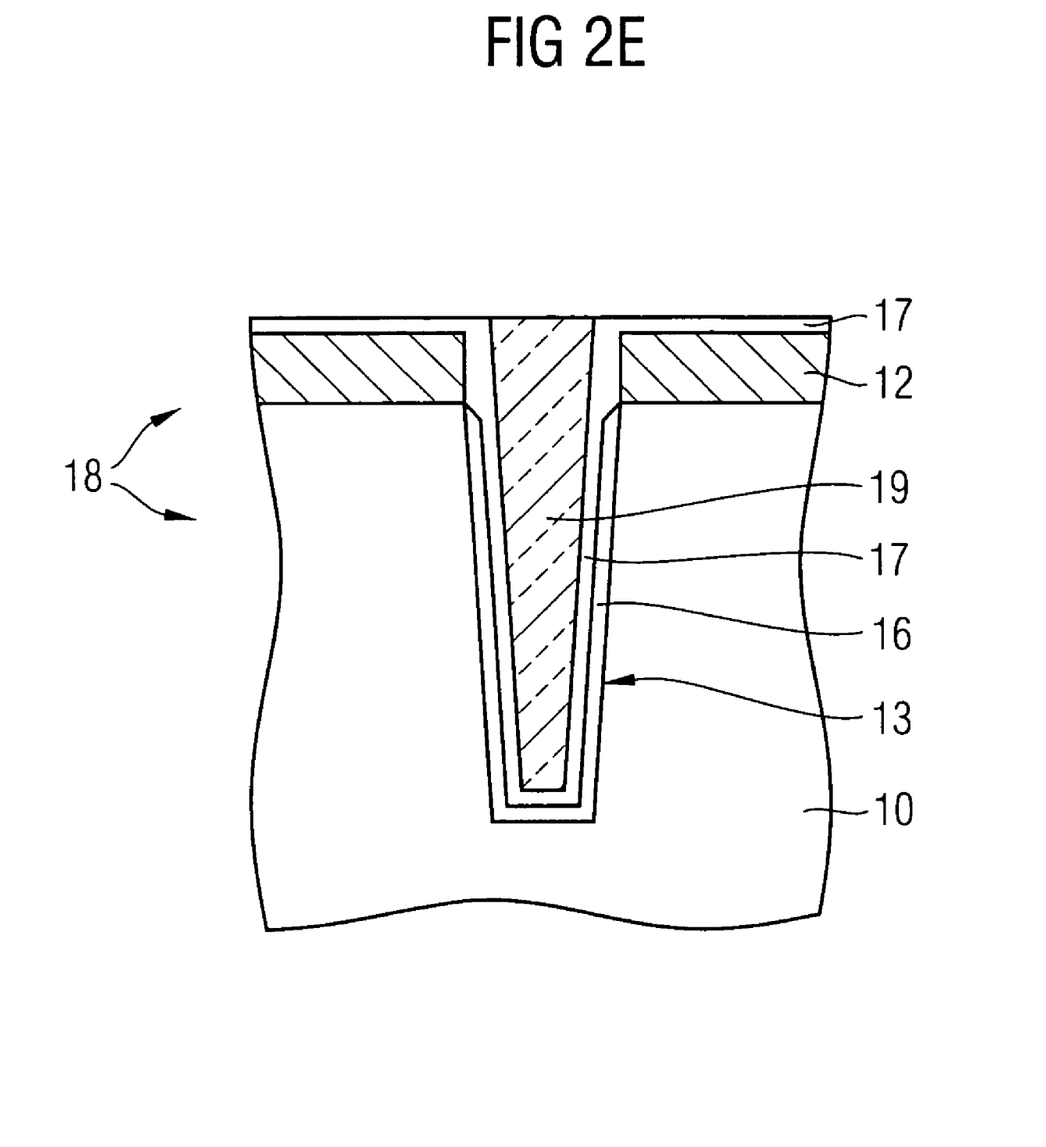
Figure 2F:
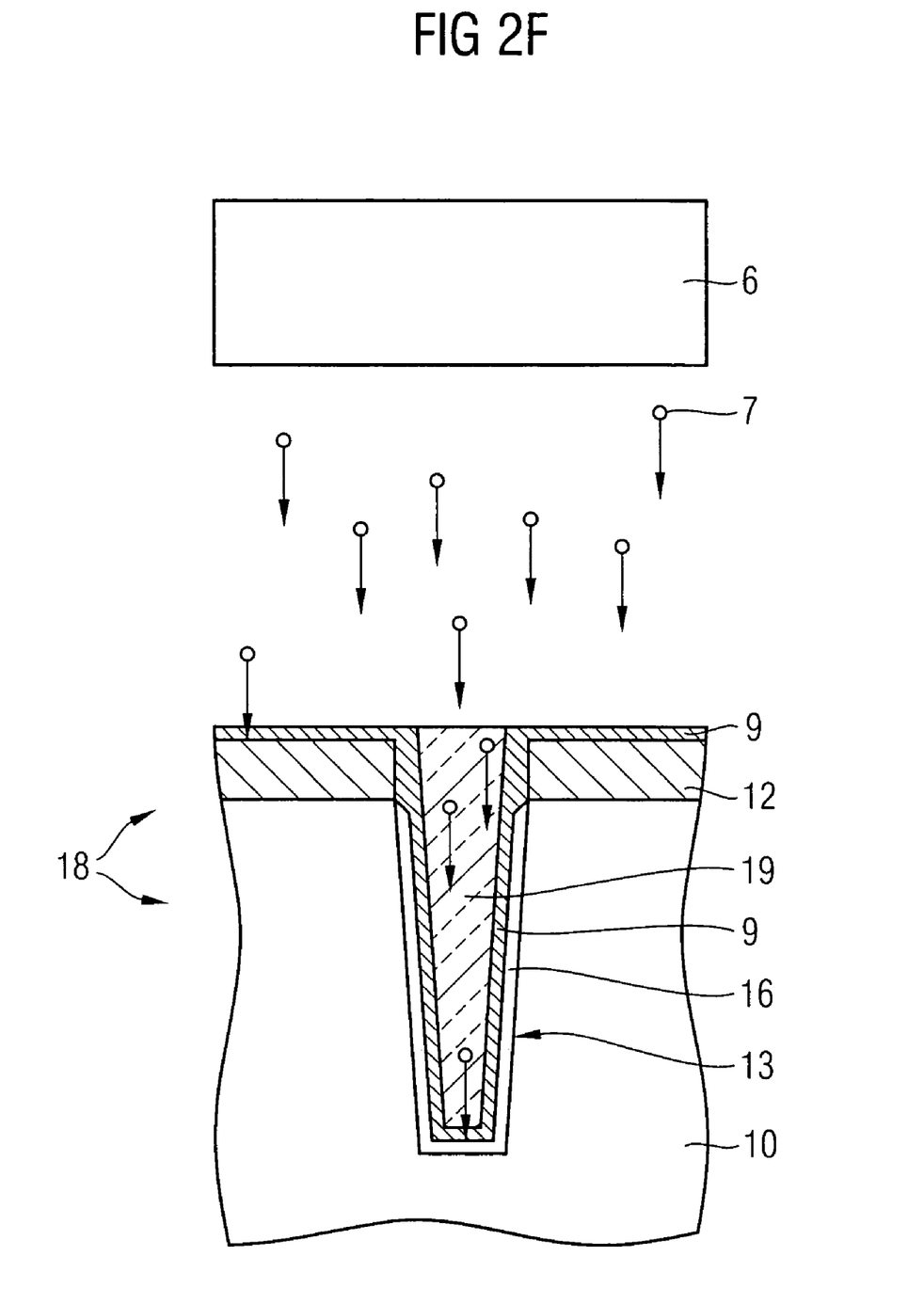

FIG. 2 shows a preferred exemplary application for the method according to the invention from FIG. 1 on the basis of schematic cross-sectional illustrations. In this case, the enumeration symbols (a)-(f) below correspond to the corresponding subfigures in FIG. 2:

(a) A semiconductor substrate 10, for example made of crystalline silicon, is provided. A mask 12 for trench etching is applied to a surface 11 of the silicon substrate 10. In the present exemplary embodiment, it shall be assumed that the mask 12 is formed as a hard mask and contains carbon or silicon nitride, by way of example.

(b) Using the mask 12, a trench 13 is etched into the surface 11 of the silicon substrate 10. A dry etching process or else a wet-chemical etching process may be used for etching the trench 13, depending on the desired requirement. In the present exemplary embodiment, the trench 13 serves for isolating adjacent memory cells and is fabricated by means of STI technology.

(c) The trench walls 14 and the trench bottom 15 are damaged to a greater or lesser extent by the etching of the trench 13. Therefore, a thin silicon oxide 16 is produced, for example by thermal oxidation, on the trench walls 14 and the trench bottom 15.

(d) Afterward, a thin silicon nitride layer 17 is applied, by deposition, to the semiconductor arrangement 18, comprising silicon substrate 10, trench 13 and mask 12. The thin silicon nitride layer 17 thus covers, in the region of the trench walls 14 and of the trench bottom 15, the thin silicon dioxide layer 16 applied thereto and, in the region of the surface 11, the mask 12 arranged thereon.

(e) Afterward, the trenches 13 are filled with a filling material, for example with silicon dioxide. In this case, the SOD method is preferably used, in which liquid material which contains silicon dioxide or can be converted into $SiO_2$ is spun onto the semiconductor arrangement 18. Afterward, this still liquid material 19 applied in this way is baked at a suitable temperature, for example at approximately 950° C., and under a suitable atmosphere. As a result, the spun-on material 19 (containing silicon dioxide) is on the one hand converted into silicon oxide and densified and on the other hand converted into a solid phase. Excess silicon dioxide 19 which is present in the region of the surface 11 and which projects from the trenches 13 is stripped away using known methods in order thereby to obtain a surface that is as far as possible planar, that is to say level. By way of example, the known CMP method (CMP=Chemical Mechanical Polishing) may be used for this purpose.

(f) Afterward, oxygen radicals 7 are generated by means of a device 6 formed as a plasma reactor and are fed to the semiconductor arrangement 18. Said oxygen radicals 7 penetrate through the silicon dioxide material of the filling layer 19 and subsequently pass to the thin silicon nitride layer 17, where the oxygen radicals 7 convert the silicon nitride layer 17 into silicon dioxide 9 in accordance with the invention. The generation of oxygen radicals 7 and the process just mentioned are carried out until the silicon nitride of the silicon nitride layer 17 has been completely converted into silicon dioxide 9. This can be set in a suitable manner by a suitable choice of the process parameters of the plasma reactor 6 and in this case in particular by a suitable choice of the temperature and the pressure in the plasma reactor 6.

Although the present invention has been described above on the basis of a preferred exemplary embodiment, it is not restricted thereto, but rather can be modified in diverse ways.

What is essential to the invention is the conversion of silicon nitride into silicon dioxide using oxygen radicals, in which case although the silicon nitride layer is preferably formed as a buried layer, it need not necessarily be present in completely buried fashion. The configuration of the substrate lying below the silicon nitride layer and also of the layer arranged above the silicon nitride layer may be as desired in this case, although the use of a semiconductor substrate below the silicon nitride layer and the use of an insulation layer containing silicon dioxide above the silicon nitride layer constitute a particularly advantageous and typical application.

Thus, the invention shall also not be restricted to use in memory components and semiconductor chips fabricated using so-called STI technology or deep trench technology, but rather can be used in a suitable manner in any desired products, which also need not necessarily be present in semiconductor-based fashion. In particular, components for micromechanics would also be conceivable here.

Although FIG. 2 illustrates only an excerpt with an individual trench, it goes without saying that over and above this a multiplicity of trenches can also be processed by means of the method according to the invention.

I claim as my invention:

1. A method for the reversible oxidation protection of microcomponents, comprising the steps of:
   providing a substrate to be protected;
   applying a silicon nitride layer on said substrate for protecting said substrate against oxidation;
   applying an insulation layer to said silicon nitride layer; and after the insulation layer is applied to said silicon nitride layer, carrying out a reoxidation process, in which oxygen radicals are generated and in which said oxygen radicals generated are passed through said insulation layer to said silicon nitride layer in order to convert silicon nitride of said nitride layer into silicon dioxide.

2. The method of claim 1, comprising semiconductor components as said microcomponents.

3. The method of claim 1, comprising a silicon substrate as said substrate.

4. The method of claim 1, comprising, after applying said insulation layer to said silicon nitride layer and before carrying out said reoxidation process, the step of densifying and converting chemically said applied insulation layer in an oxygen-containing atmosphere at high temperature.

5. The method of claim 1, comprising performing said reoxidation process at a low process temperature in the range of 700° C. to 850° C.

6. The method of claim 1, comprising performing said reoxidation process at a low process temperature at a process temperature of approximately 750° C.

7. The method of claim 1, comprising providing an oxygen radical oxidation process or an ISSG process as said reoxidation process.

8. The method of claim 1, comprising continuing said reoxidation process until the entire silicon nitride of said silicon nitride layer has been converted into said silicon dioxide.

9. The method of claim 1, comprising choosing the process parameters of said reoxidation process such that said oxygen radicals generated diffuse completely through said insulation layer and are passed as far as said silicon nitride layer and said silicon nitride layer is completely converted into silicon dioxide by means of said oxygen radicals without oxidizing said substrate lying below said silicon nitride layer by said oxygen radicals.

10. The method of claim 1, wherein said oxygen radicals are generated by means of a plasma at low pressure.

11. The method of claim 1, wherein said insulation layer comprises at least one of silicon dioxide or a material comprising silicon dioxide.

12. The method of claim 1, comprising annealing said insulation layer, after being applied to said silicon nitride layer, for densifying said insulation layer.

13. The method of claim 1, comprising, before applying said silicon nitride layer on said substrate, applying a thin silicon dioxide layer to said substrate.

14. The method of claim 1, wherein said silicon nitride layer is present as a buried silicon nitride layer after applying said insulation layer to said silicon nitride layer.

15. The method of claim 1, wherein said silicon nitride layer has a layer thickness of 0.1 nm to 100 nm.

16. The method of claim 1, wherein said silicon nitride layer has a layer thickness of approximately 1 nm to 2 nm.

17. The method of claim 1, wherein said substrate comprises at least one trench with trench walls and said silicon nitride layer is applied in the region of said at least one trench on at least parts of said trench walls.

18. The method of claim 1, comprising providing a patterned silicon substrate as said substrate.

19. The method of claim 10, comprising using a pressure in the range of 0.1 torr to 1000 torr for generating said plasma.

20. The method of claim 10, comprising using a pressure in the range of 1 torr to 100 torr for generating said plasma.

21. The method of claim 12, comprising annealing said insulation layer at process temperatures in the range of 800° C. to 1050° C.

22. The method of claim 12, comprising annealing said insulation layer at process temperatures in the range of 850° C. to 950° C.

* * * * *